(12) United States Patent
Lu et al.

(10) Patent No.: US 11,404,383 B2
(45) Date of Patent: *Aug. 2, 2022

(54) MAGNETIC SHIELDING MATERIAL WITH INSULATOR-COATED FERROMAGNETIC PARTICLES

(71) Applicant: Taiwan Semiconductor Manufacturing Co., Ltd., Hsinchu (TW)

(72) Inventors: Tsung-Hsing Lu, Hsinchu (TW); Pei-Haw Tsao, Hsinchu (TW); Li-Huan Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,544

(22) Filed: Oct. 21, 2020

(65) Prior Publication Data

US 2021/0035920 A1 Feb. 4, 2021

Related U.S. Application Data

(63) Continuation of application No. 16/405,642, filed on May 7, 2019, now Pat. No. 10,892,230.

(60) Provisional application No. 62/711,997, filed on Jul. 30, 2018.

(51) Int. Cl.
*H01L 23/552* (2006.01)
*H05K 9/00* (2006.01)
*H01L 23/495* (2006.01)

(52) U.S. Cl.
CPC ........ *H01L 23/552* (2013.01); *H01L 23/4952* (2013.01); *H05K 9/0086* (2013.01)

(58) Field of Classification Search
USPC ........................................................ 257/659
See application file for complete search history.

(56) References Cited

U.S. PATENT DOCUMENTS 10,892,230 B2 * 1/2021 Lu ....................... H01L 23/4952

FOREIGN PATENT DOCUMENTS

| CN | 2653693 Y | 11/2004 |
|---|---|---|
| CN | 1808702 A | 7/2006 |
| CN | 101188230 A | 5/2008 |
| CN | 102574934 A | 7/2012 |
| CN | 102568733 B | 2/2015 |
| CN | 105518850 A | 4/2016 |
| CN | 105556659 A | 5/2016 |
| TW | 200608546 A | 3/2006 |
| TW | 201735064 A | 10/2017 |

OTHER PUBLICATIONS

Bhushan et al., "Enhancing Magnetic Immunity of STT-MRAM with Magnetic Shielding," 2018 IEEE International Memory Workshop (IMW), Kyoto, Japan, May 13-16, 2018, pp. 139-142.

* cited by examiner

*Primary Examiner* — Tong-Ho Kim
(74) *Attorney, Agent, or Firm* — Seed IP Law Group LLP

(57) ABSTRACT

A non-conductive magnetic shield material is provided for use in magnetic shields of semiconductor packaging. The material is made magnetic by the incorporation of ferromagnetic particles into a polymer matrix, and is made non-conductive by the provision of an insulating coating on the ferromagnetic particles.

20 Claims, 5 Drawing Sheets

MAGNETIC SHIELDING MATERIAL WITH INSULATOR-COATED FERROMAGNETIC PARTICLES

BACKGROUND

Many electronic devices produce electromagnetic radiation (EMR), either by design, or as an unintended, or even undesirable byproduct of their normal operation. On the other hand, many electronic devices are sensitive to magnetic or electromagnetic radiation, which can, at sufficient strength interfere with operation, corrupt data storage, or actually cause damage. In some cases, for proper operation of a circuit it is preferable, or even necessary to position a device that produces EMR in close proximity to a device that is sensitive to EMR. In other cases, an electronic device that is sensitive to EMR is part of a circuit or product that may be required to operate in environments where EMR of significant strength is likely to be present. Depending upon the circumstances, magnetic shielding may be required at any level, including the product level, the inter-circuit level between circuits on a circuit board or between circuit boards, the inter-chip level between chips on a circuit board, the package level protecting the one or more integrated circuits in a package, and even the inter-circuit level between circuits on a single IC chip.

Ferromagnetic metals and their alloys having high magnetic permeability are effective shields for static and low frequency EMR. These can include, for example, elemental iron (Fe), mu-metal, and permalloy, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
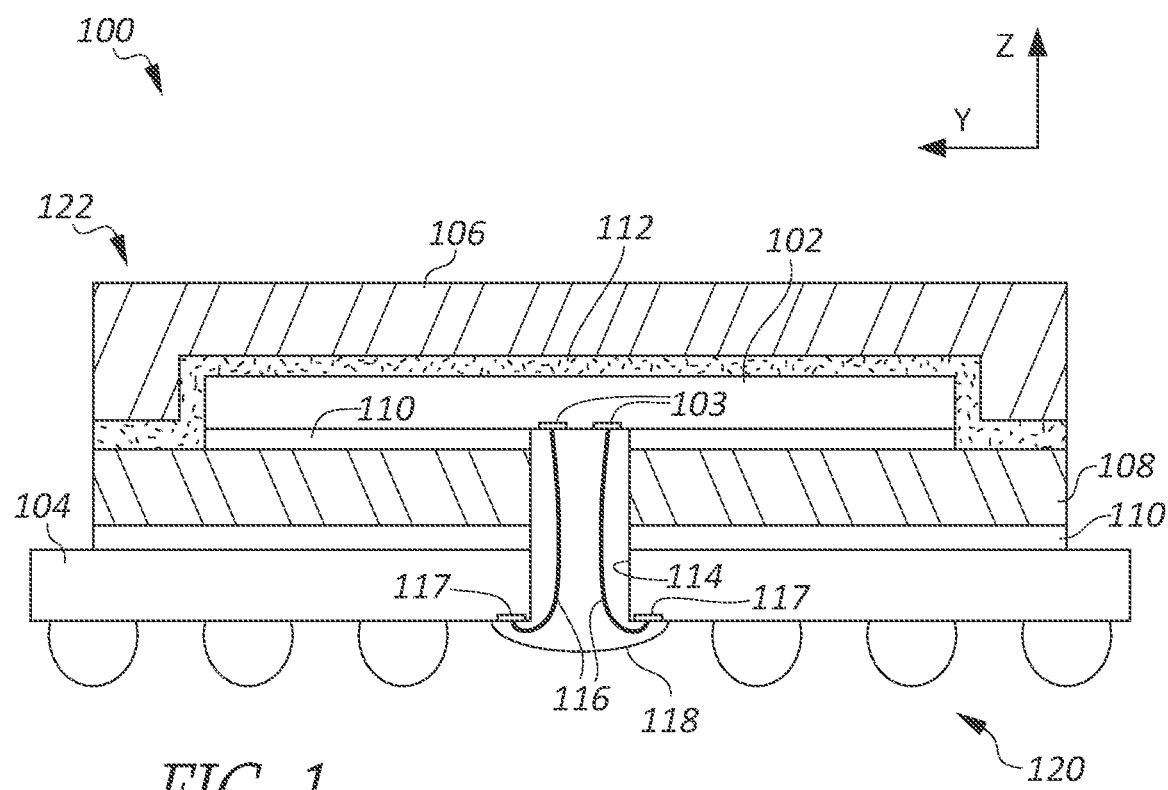
FIG. 1 is a diagrammatic side-sectional view of a wire-bond-type IC package with package-level magnetic shielding.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagrammatic side-sectional view of a wire-bond-type IC package 100 with package-level magnetic shielding. The package 100 includes an integrated circuit die 102 having contact terminals 103, mounted to a package substrate 104, together with upper and lower magnetic shield plates 106, 108. Layers of epoxy 110 bond the die 102 to the lower shield plate 108 and the lower shield plate 108 to the package substrate 104. A layer of magnetic epoxy 112 bonds the top shield plate 106 to the die 102 and the lower shield plate 108. A wire-bond window 114 extends through the lower shield plate 108 and the package substrate 104, and bond wires 116 electrically couple the contact terminals 103 of the die 102 to terminals 117 of the package substrate 104. A "glob-top" fill or molding compound 118 encapsulates and protects the bond wires 116 from damage. A ball grid array 120 is positioned on the bottom of the package substrate 104, and is configured to electrically couple the package 100 to a corresponding contact array on a circuit board or analogous substrate. A magnetic shield 122 is formed by and includes the upper and lower shield plates 106, 108 and the magnetic epoxy 112.

In embodiments in accordance with the present disclosure, the magnetic epoxy 112 is a matrix of epoxy material containing ferromagnetic particles. The magnetic epoxy 112, particularly in the regions where it bonds the upper shield plate 106 to the lower shield plate 108, completes the magnetic "circuit" of the shield enclosure formed by the upper and lower shield plates 106, 108, which otherwise would be open around the entire perimeter.

As magnetic field strength increases, a magnetic shield will tend to become saturated, at which point its effectiveness as a shield drops off. Higher magnetic permeability materials saturate at higher magnetic field strengths, meaning that, other factors being equal, a shield having a higher magnetic permeability will protect against higher magnetic field strengths than a lower magnetic permeability shield. Accordingly, the magnetic shield plates 106, 108 and the ferromagnetic particles of the magnetic epoxy 112 will often be made of material with a high magnetic permeability, such as mu-metal, permalloy, elemental iron, soft iron alloy, etc. However, embodiments of the present disclosure are not limited to materials exhibiting a magnetic permeability falling within a particular range, inasmuch as an appropriate magnetic permeability, in a given instance, will depend upon the susceptibility of the device to be protected from harm due to magnetic fields, as well as the environment in which the device is to be operated. Accordingly, embodiments are envisioned in which a relatively low magnetic permeability is acceptable, and others in which a very high magnetic permeability is appropriate. In accordance with other embodiments of the present disclosure, ferromagnetic particles not considered to have a high magnetic permeability are present in the magnetic shield in combination with ferromagnetic particles having a different magnetic permeability, e.g., higher magnetic permeability. Embodiments of the present disclosure are not limited to the specific ferromagnetic materials described above. Other materials exhibiting ferromagnetic properties and higher or lower magnetic permeability may be used in a magnetic shield in accordance with the present disclosure.

Terms such as conductive and non-conductive, and the like, are used herein with reference, specifically, to electrical conductivity.

In tests conducted with a structure like that shown in FIG. 1, it was found that, in general, the structure was effective in attenuating a magnetic field applied perpendicular to the package substrate 104—i.e., parallel to the Z axis. However, in the region of the die 102 lying directly over the wire-bond window 114, attenuation of the magnetic field was not as great—e.g., magnetic field strength in that region of the die increased by about 400%-600%.

The inventors have recognized that if the fill material of the glob top or molding compound 118 were formulated with ferromagnetic particles, similar to the magnetic epoxy 112, this would eliminate the weak spot in the magnetic shield protecting the die 102. However, the inventors also recognized that this is not practical, because the high particle loading would render the fill material conductive, and electrically short the bond wires 116.

As a result, most magnetically shielded semiconductor package designs have vulnerable regions, particularly where electrical connectors are used to electrically couple a semiconductor die to a package element, such as the package substrate 104, in the present example, that provides input and output connections to the exterior of the package.

Epoxy, per se, is not typically electrically conductive, nor does it have any magnetic properties that are of particular interest here. The magnetic epoxy 112 is made magnetically permeable by addition of ferromagnetic particles suspended in the epoxy matrix, but those particles also tend to increase conductivity of the epoxy/particle mixture. As noted above, in an application where magnetic shielding is required, the particles are preferably highly magnetically permeable. However, the permeability of the magnetic epoxy 112 depends not only upon the permeability of the particles, but also on the density of the particles in the mixture. As the volume ratio of particles to total volume (i.e., epoxy matrix+ particles) increases, the effective permeability of the mixture increases. Thus, a higher particle volume:mixture volume ratio (hereafter, PMR) is preferable for effective magnetic shielding. However, above a threshold PMR, the mixture becomes electrically conductive. A magnetic material that provides any significant magnetic shielding will typically have a PMR above a conduction threshold volume ratio (hereafter, CTR) of the material which is the PMR at which the material become conductive.

Figure 2A:
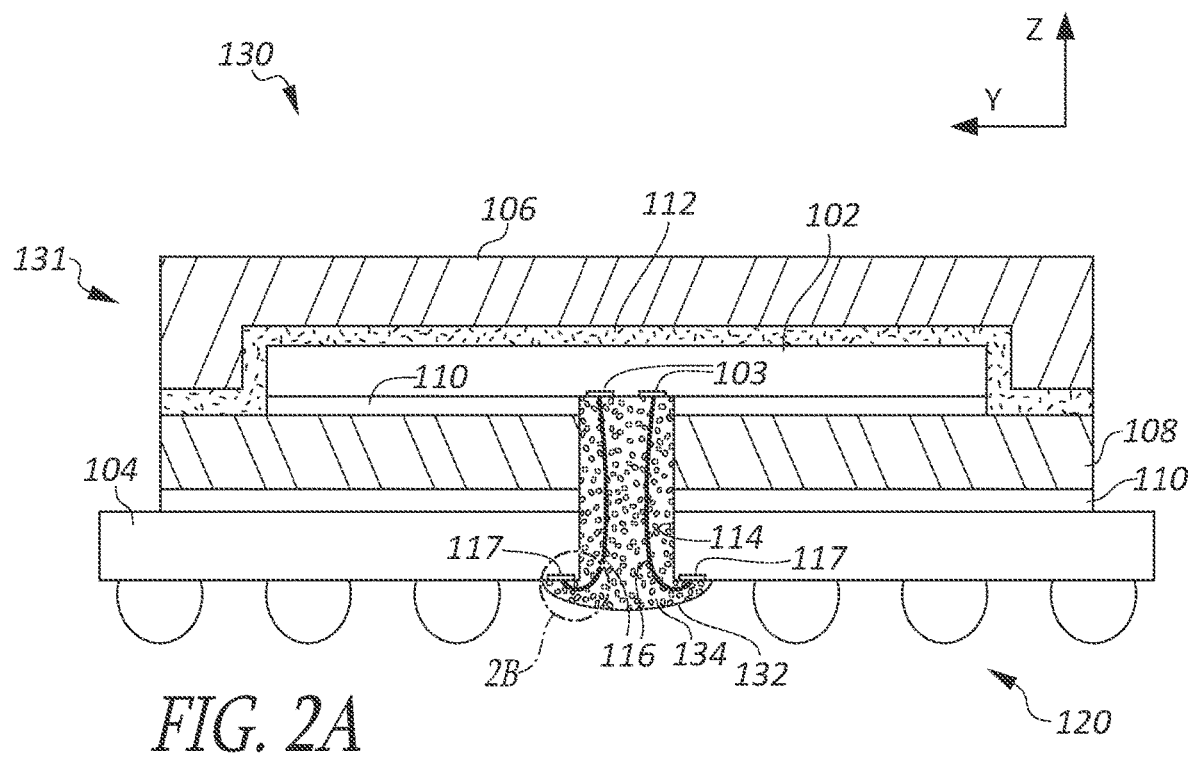
FIG. 2A is a diagrammatic side-sectional view of a wire-bond-type IC package with package-level magnetic shielding, according to an embodiment.
Figure 2B:
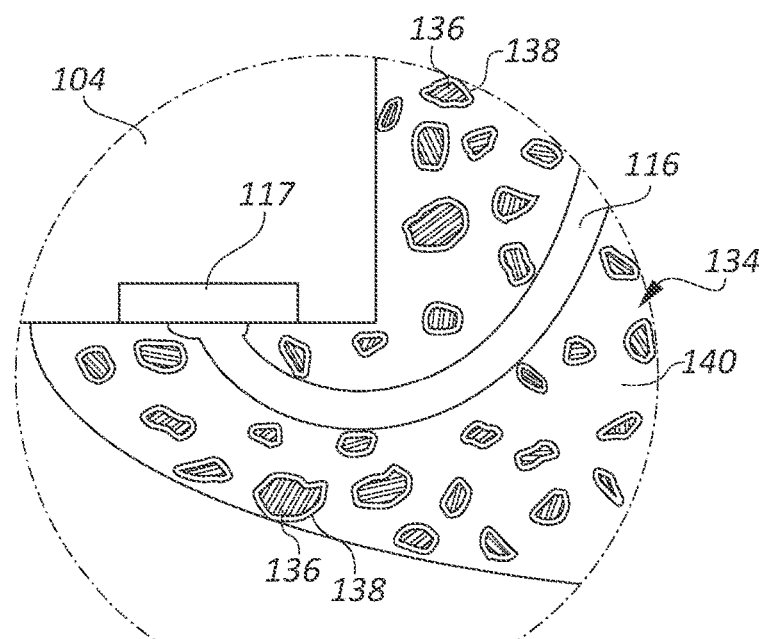
FIG. 2B is an enlarged view of a portion 2B of the package of FIG. 2A.

FIG. 2A is a diagrammatic side-sectional view of a wire-bond-type IC package 130 with package-level magnetic shielding, according to an embodiment. FIG. 2B is an enlarged view of a portion 2B of the package 130 of FIG. 2A. The package 130 is similar in most respects to the package 100 of FIG. 1, except that it comprises a magnetic shield 131 that includes a glob top closure or molding compound 132 formed with a non-conductive magnetic fill material 134 that contributes to the magnetic shielding of the package provided by the other elements of the magnetic shield, 131, i.e., upper and lower shield plates 106, 108 and magnetic epoxy 112. In the embodiment of FIG. 2A, the bond wires 116 extend through the non-conductive magnetic fill material 134, which encapsulates and insulates them. In accordance with disclosed embodiments, the PMR falls within a range of between about 10% and about 80%. In other embodiments, the PMR falls within a range of between about 30% and about 60%. Embodiments of the present disclosure are not limited to PMRs that fall within the above ranges. In other embodiments in accordance with the present disclosure, PMR may fall below the lower ends of the above ranges or above the upper ends of the above ranges.

FIG. 2B, which shows an enlarged portion of the wire-bond window 114 and glob-top closure or molding compound 132, shows, in particular, details of the non-conductive magnetic fill material 134. The non-conductive magnetic fill material 134 includes a high percentage of ferromagnetic particles 136, each of which has an insulating coating 138. The coated ferromagnetic particles 136 are suspended in a matrix 140 of non-conductive material. The insulating coatings 138 electrically insulate the ferromagnetic particles 136 from each other, making the mixture non-conductive at a higher PMR than the magnetic epoxy 112, while providing an adequate level of magnetic shielding. This is possible, in part, because the insulating coating 138 imposes a minimum insulator thickness between adjacent ferromagnetic particles 136 in the mix, as explained in more detail below.

Referring again to the magnetic epoxy 112 of FIG. 1, ferromagnetic particles are suspended in a matrix of non-conductive epoxy material in a substantially random distribution within the matrix, so that the space between some of the particles is many time greater than the space between other particles. Even at a relatively low PMR, there are likely to be many particles that are in physical contact with each other, with effectively no insulating material separating them, while other particles will be many times farther apart than an overall average particle spacing. The PMR primarily defines the average spacing of particles in the mixture, not the individual spacing, but the individual spacing is a critical factor of the CTR.

As ferromagnetic particles are added to the matrix of non-conductive epoxy and the PMR increases, more and more of the ferromagnetic particles are spaced closer and closer together. Eventually, a particle density is reached—i.e., the CTR—at which it is a near certainty that there will be one or more paths, within the aggregate of non-conductive epoxy and ferromagnetic particles, extending from ferromagnetic particle to ferromagnetic particle through the matrix of non-conductive epoxy, in which each pair of adjacent ferromagnetic particles in the path are spaced closely enough to each other that the total thickness of insulating material along the path is small enough that an applied voltage produces dielectric breakdown, and the path of ferromagnetic particles in the matrix becomes electrically conductive. Nevertheless, at that PMR the ferromagnetic particle spacing along that electrically conductive path is much lower than the overall average spacing of ferromagnetic particles within the aggregate of the non-conductive epoxy and ferromagnetic particles. If, instead, the spacing between every ferromagnetic particle in the matrix of non-conductive epoxy were constrained, so that no two ferromagnetic particles could be positioned any closer than some minimum distance, the CTR, i.e., the minimum PMR at which the mixture of ferromagnetic particles and non-conductive epoxy begins to conduct, would be much higher.

Turning, now, to the non-conductive magnetic fill material 134 of FIG. 2B, the distribution of the ferromagnetic particles 136 in the non-conducting matrix is random, just as in the magnetic epoxy 112 (FIG. 2A). However, in this case, when two of the ferromagnetic particles 136 bump into each other, they are still separated by the thicknesses of their respective insulating coatings 138. The closest spacing possible between any two of the particles is equal to the sum of the thickness of the insulating coating on each of the particles. When the thickness of the insulating coating 138 on each of the ferromagnetic particles is equal, the closest spacing possible between any two particles is equal to twice the thickness of the insulating coating 138. This is a minimum insulator thickness that is imposed by the insulating coatings 138 on the ferromagnetic particles 136.

Thus, assuming ferromagnetic particles of equal size and composition, the magnetic epoxy 112 of FIG. 1 and the non-conductive magnetic fill material 134 of FIGS. 2A, 2B will have equal permeabilities at equal PMRs. However, other factors being equal, the CTR of the non-conductive magnetic fill material 134 will be higher than that of the magnetic epoxy 112. It should be noted that, for purposes of determining the particle:mixture ratio of the non-conductive magnetic fill material 134, the insulating coating 138 on the ferromagnetic particles 136 is included in the mixture, along with the matrix 140 and the particles.

The size of the ferromagnetic particles 136 can vary, but falls, according to various embodiments, generally in a range of between about 0.1 micron to about 100 microns in average diameter. According to an embodiment, an average diameter of the ferromagnetic particles is between about 1 and 30 microns. Embodiments in accordance with the present disclosure are not limited to ferromagnetic particles having average diameters falling within the above ranges. According to other embodiments, ferromagnetic particles used in non-conductive magnetic fill materials have average diameters less than 0.1 micron or greater than 100 microns. In some embodiments, regular, i.e., non-ferromagnetic fillers/particles may also be added into the molding compound or underfill along with the inclusion of ferromagnetic fillers. The particle size of ferromagnetic fillers/particles added in the molding compound may be different from the size added in the underfill. For example, the particle size in the molding compound will be larger, and the particle size in the underfill may be smaller due to their functionalities. In some embodiments, for the underfill, the particle size will be about single digit microns, while for the molding compound, the particle size will be about double-digit micron size.

The insulating coating 138 on the ferromagnetic particles 136 can be any appropriate insulator/dielectric material compatible with the material of the non-conductive matrix of the non-conductive magnetic fill material 134. For example, according to an embodiment, the insulating coating 138 is an electrically non-conductive polymer material that is deposited via physical or chemical processes/reaction. Examples of polymer materials useful as insulating coating 138 include polyethylene, styrene-acrylic, and carboxylated styrene-butadiene. According to a further embodiment, the insulating coating 138 is an inorganic compound, such as a dielectric oxide, silicon dioxide, for example, or a ceramic material. The material of the matrix can be any appropriate material for the particular application, including, for example, silicone, epoxy, and other polymers, etc.

The thickness of the insulating coating 138, which controls the minimum insulator thickness, varies according to ferromagnetic particle size, the dielectric constant of the material of the coating, and a desired dielectric strength of the mixture. It will be understood that if the ferromagnetic particles 136 are relatively large, the number of ferromagnetic particles required to form a conductive path between two points will be fewer than if the ferromagnetic particles are relatively smaller. With fewer ferromagnetic particles in the path, and assuming a total value of insulator thickness along the path required to prevent conduction is constant, then the average insulator thickness between each adjacent pair of ferromagnetic particles in the path is greater for larger ferromagnetic particles than for smaller ferromagnetic particles. Similarly, the minimum insulator thickness is also greater for large particles than for smaller ones. Thus, the minimum thickness of the insulating coating and particle size are directly related. Another factor affecting the desired thickness of the insulating coating 138 is the dielectric constant of the material of the insulating coating 138. High-k dielectrics have a higher breakdown voltage, and can thus withstand a higher voltage at a given thickness, so a coating of a high-k dielectric material can be thinner than a lower k dielectric material, for a given voltage. Thus, the minimum insulator coating thickness and the dielectric constant of the coating material are inversely related. In accordance with embodiments of the present disclosure, the insulating coating 138, has a thickness ranging from about 0.01 microns to about 3 microns. In other embodiments, the thickness of the insulating coating 138 falls within a range of about 0.05 microns to about 2 microns. In other embodiments, the insulating coating 138, has a thickness that is less than the lower end of the ranges described above or greater than the upper end of the ranges described above.

The insulator-coated ferromagnetic particle:mixture volume ratio of the non-conductive fill material 134 is selected to be lower than the CTR of the mixture in the intended application, and to have a magnetic permeability that is adequate to provide a desired degree of magnetic shielding. It should be noted that the design parameters of the device, which include the spacing of the bond wires 116, the maximum voltage differences applied across any two of the wires, etc., will impose a minimum dielectric strength of the mixture necessary to avoid dielectric breakdown during operation of the device. This, in turn, will impose a maximum PMR value, so the magnetic permeability of the mixture may be limited by the dielectric strength requirements of the device. These imposed values can be modified at the design stage, in a number of ways. For example, spacing of the bond wires can be modified, electrical paths between which the highest voltage differences will be applied can be assigned to wires that are farthest apart in the array, the material of the insulating coating on the ferromagnetic particles can be selected to have a higher k value, and the material of the epoxy matrix can be selected to have a higher breakdown voltage.

Referring again to FIG. 2A, according to another embodiment, the upper shield plate 106 is bonded to the die 102 and the lower shield plate 108 by a layer of non-conductive epoxy 110, which includes ferromagnetic particles that each have an insulating coating, as described with reference to the non-conductive magnetic fill material 134.

The package 130 described above with reference to FIGS. 2A and 2B is provided as one example of a device that can benefit from a non-conductive magnetic shield in accordance with embodiments of the present disclosure. Other package configurations are contemplated, that can also benefit similarly. FIGS. 3-14 are diagrammatic side-sectional views of various semiconductor packages, with package-level magnetic shielding, according to respective embodiments of the present disclosure.

Figure 3:
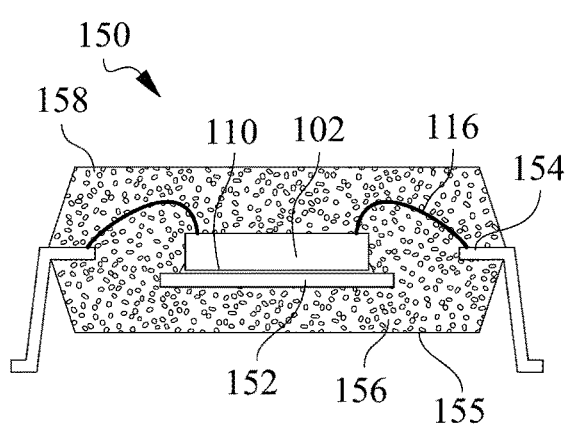
FIGS. 3-14 show examples of various types of semiconductor packages employing non-conductive magnetic shielding material, according to respective embodiments.

FIG. 3 shows a surface-mount lead-frame package 150, according to an embodiment, in which the semiconductor die 102 is bonded to a lead frame paddle 152 by a layer of epoxy 110. The die 102 is wire bonded to fingers 154 of the lead frame, and the die 102, bond wire 116, and paddle 152 are encased in a package body 155 of a non-conductive magnetic molding compound 156. The non-conductive magnetic molding compound 156 includes ferromagnetic particles with insulating coatings substantially as described with reference to FIG. 2B. The non-conductive magnetic molding compound 156 acts as a magnetic shield 158, to protect the die 102 from magnetic interference.

Figure 4:
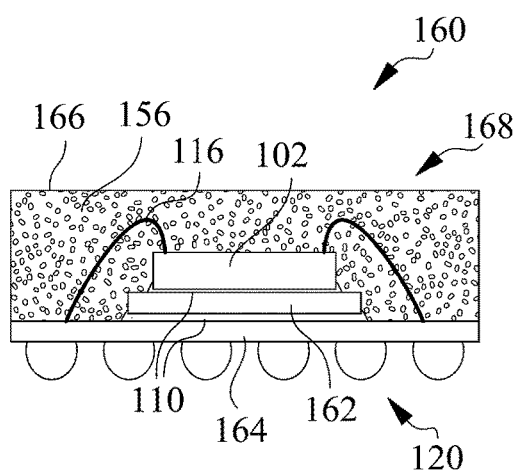

FIG. 4 shows a wire-bond ball-grid-array package 160, according to an embodiment. The die 102 is bonded to a magnetic heat spreader 162 by a layer of epoxy 110. Contacts on the die 102 are electrically coupled to a package substrate 164 via bond wires 116, and thence to a ball grid array 120 via electrical traces formed in the substrate 164. A package body 166 of non-conductive magnetic molding compound 156 encapsulates the die 102, heat spreader 162, and wire bonds 116 on the package substrate 164 is and forms, with the magnetic heat spreader, a magnetic shield 168.

Figure 5:
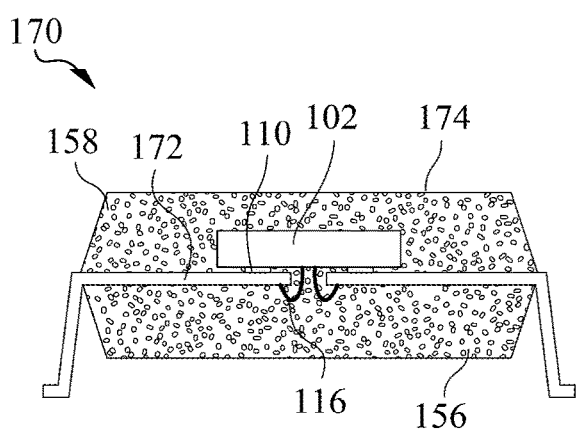

FIG. 5 shows a wire-bond lead-frame package 170, according to an embodiment, in which the die 102 is mounted to frame fingers 172 by deposits of adhesives (a layer of epoxy 110). Bond wires 116 electrically couple electrical contacts of the die 102 to respective frame fingers 172 and the die 102, bond wires 116, and fingers 172 are encapsulated in a package body 174 of non-conductive magnetic molding compound 156, that acts as a magnetic shield 158.

Figure 6:
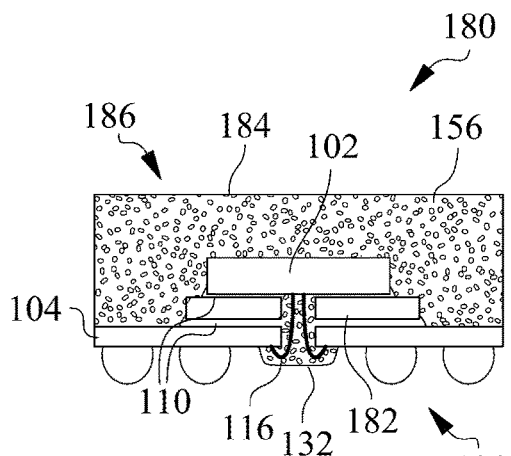

FIG. 6 shows a wire-bond ball-grid-array package 180, according to an embodiment, in which the die 102 is bonded to a heat spreader 182, which is in turn bonded to a package substrate 104 by layers of epoxy 110. Bond wire 116 electrically couples the die 102 to the package substrate 104 via a wire-bond window formed in the heat spreader 182 and the package substrate 104. A ball grid array 120 is positioned on the bottom face of the package substrate 104. A package body 184 of non-conductive magnetic molding compound 156 encapsulates the die 102 and heat spreader 182 on the package substrate 104. A glob top closure or molding compound 132 formed with a non-conductive magnetic fill material 134—which, according to one embodiment, is substantially similar to the non-conductive magnetic molding compound 156 described above with reference to FIGS. 2A and 2B—protects the bond wires 116. A magnetic shield 186 comprises the package body 184, the heat spreaders 182 and the glob top closure or molding compound 132.

Figure 7:
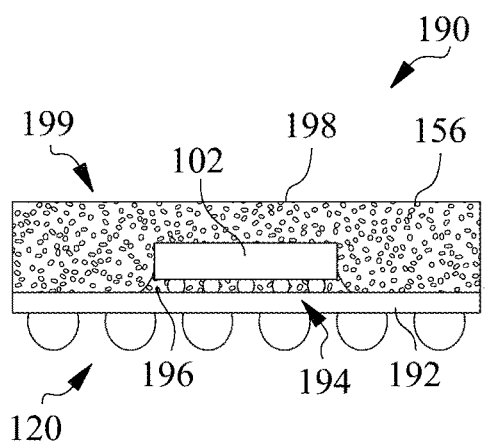

FIG. 7 shows a flip-chip ball-grid-array package 190, according to an embodiment, in which the die 102 is coupled to a package substrate 192 via a micro-ball or bump array 194. A ball grid array 120 is positioned on the bottom face of the package substrate 192. A non-conductive magnetic underfill layer 196 is positioned between the die 102 and the package substrate 192, and a package body 198 of non-conductive magnetic molding compound 156 encapsulates the die 102 on the package substrate 192. The non-conductive magnetic underfill layer 196 includes ferromagnetic particles with insulating coatings substantially as described above with reference to FIG. 2B. A magnetic shield 199 is provided, which includes the package body 198 and the underfill layer 196.

According to an alternative embodiment in accordance with the present disclosure, in FIG. 7, the underfill layer 196 is omitted. During encapsulation, the non-conductive magnetic molding compound 156 fills the gap between the underside of die 102 and the package substrate 192, and forms a part of magnetic shield 199.

In some cases, further magnetic shielding can be employed, in addition to the shielding provided by, for example, a package body of a magnetic molding compound in accordance with embodiments described above. The embodiments of FIGS. 8-14 provide examples of semiconductor packages that employ shield plates and similar structures, formed of high-permeable material similar to the shield plates 106, 108 described with reference to FIGS. 1 and 2A.

Figure 8:
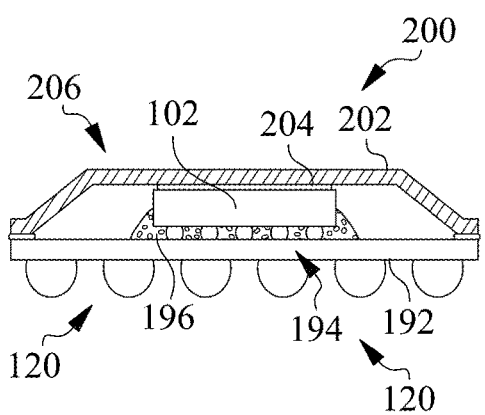

FIG. 8 shows a flip-chip ball-grid-array package 200, according to an embodiment, in which the die 102 is coupled to a package substrate 192 via a micro ball or bump array 194. A heat spreader 202 is coupled to the upper surface of the die 102 via a thermally conductive grease 204. The heat spreader 202 is formed of a material having a high permeability, so as to function as part of a magnetic shield 206 that includes an underfill layer 196, as well.

Figure 9:
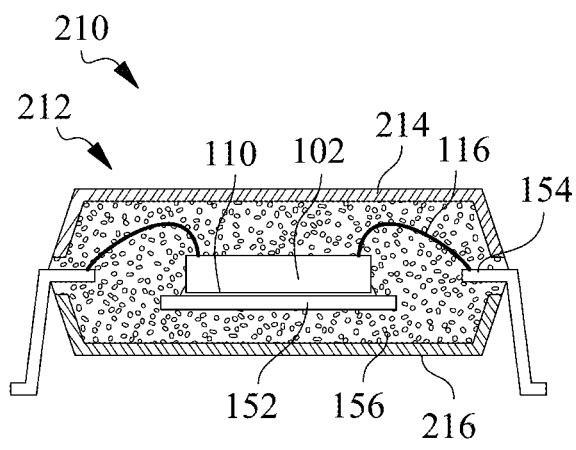

FIG. 9 shows a semiconductor package 210, according to an embodiment. The package 210 is similar in most respects to the package 150 of FIG. 3, but also includes a package case 212 that comprises upper and lower magnetic shield plates 214, 216.

Figure 10:
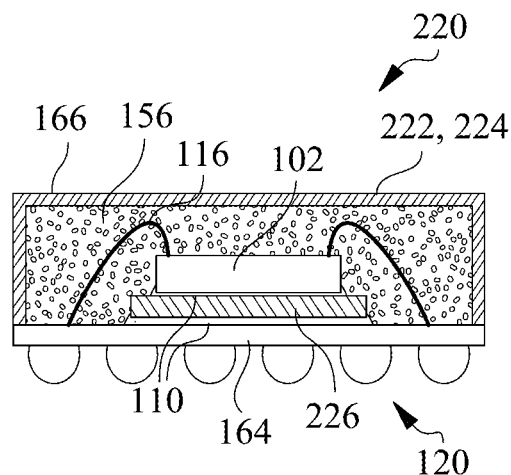

FIG. 10 shows a semiconductor package 220, according to an embodiment. The package 220 is similar in most respects to the package 160 of FIG. 4, but also includes a package case 222 that comprises an upper magnetic shield plate 224. A heat spreader 226 is provided below die 102. Heat spreader 226 is made of a material with a high-permeability, and functions as a lower magnetic shield plate.

Figure 11:
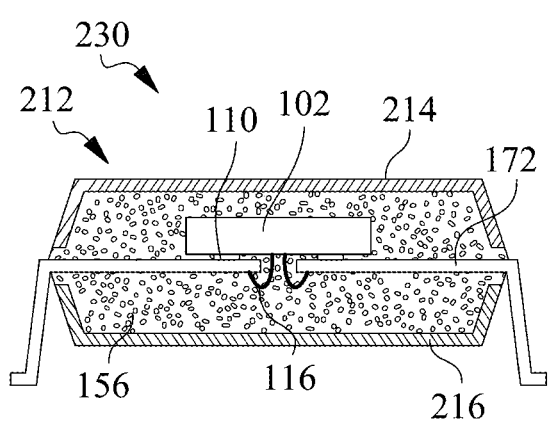

FIG. 11 shows a semiconductor package 230, according to an embodiment. The package 230 is similar in most respects to the package 170 of FIG. 5, but also includes a package case 212 that comprises upper and lower magnetic shield plates 214, 216.

Figure 12:
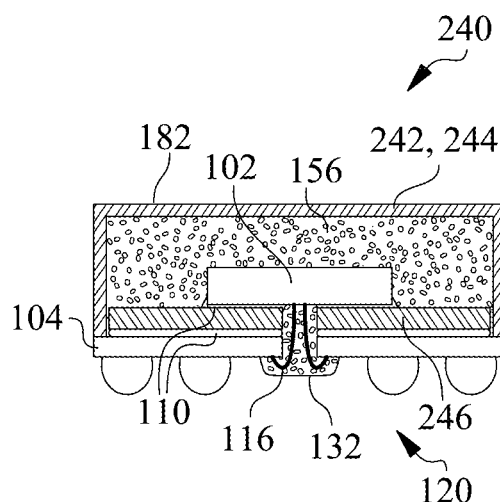

FIG. 12 shows a semiconductor package 240, according to an embodiment. The package 240 is similar in most respects to the package 180 of FIG. 6, but also includes a package case 242 that comprises an upper magnetic shield plate 244. A heat spreader 246 is provided below die 102 and is made of a material with a high-permeability. Heat spreader 246 functions as a lower magnetic shield plate. The left and right sides of the upper shield plate 244 extend around and over the lower shield plate/heat spreader.

Figure 13:
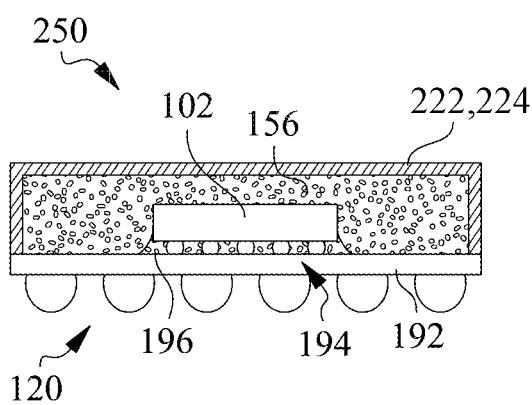

FIG. 13 shows a semiconductor package 250, according to an embodiment. The package 250 is similar in most respects to the package 190 of FIG. 7, but also includes a package case 222 that comprises an upper shield plate 224.

Figure 14:
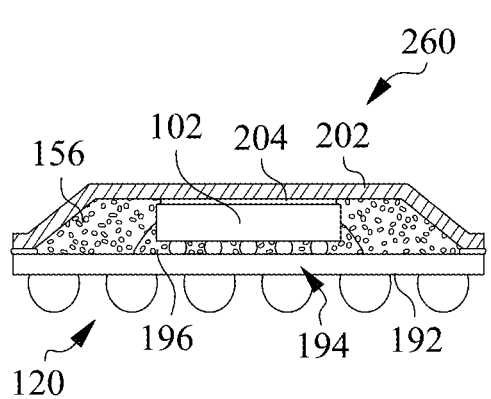

FIG. 14 shows a semiconductor package 260, according to an embodiment. The package 260 is similar in most respects to the package 200 of FIG. 8, but in addition to the underfill layer 196, includes a non-conductive magnetic molding compound 156 that fills the balance of the package 260.

Figure 15:
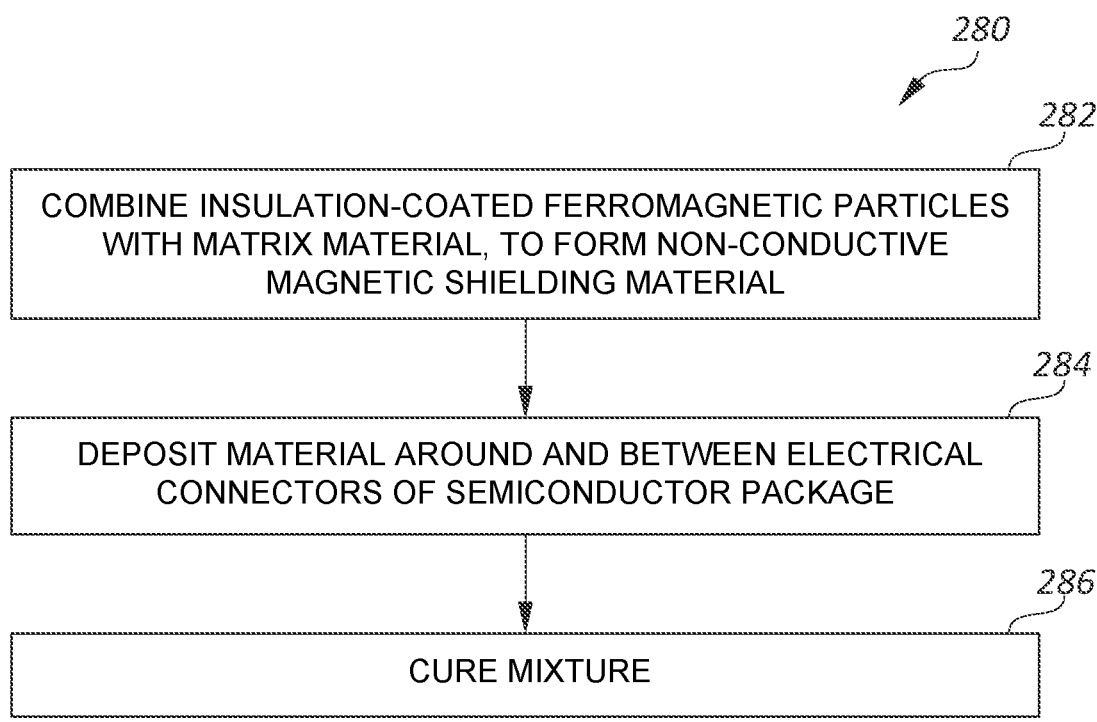
FIG. 15 is a flow chart outlining a method for magnetically shielding a semiconductor package 280, according to an embodiment.

FIG. 15 is a flow chart outlining a method for magnetically shielding a semiconductor package 280, according to an embodiment of the present disclosure. At step 282, a non-conductive magnetic mixture is formed, by combining a plurality of ferromagnetic particles, each having an insulating coating, with a matrix material, at a volume ratio that imparts a selected magnetic permeability to the mixture.

At step 284, the mixture is positioned around and between a plurality of electrical connectors that electrically couple contact terminals of a semiconductor die with contact terminals of an input/output interface of the semiconductor package, and at step 286, the mixture is cured.

According to an embodiment, the mixture is a glob-top fill material or molding compound that is positioned within a wire-bond window of the package, and that protects bond wires that couple contact terminals of the semiconductor die with contact terminals of a package substrate. According to another embodiment, the mixture is an underfill material or molding compound that surrounds and protects a plurality of bumps that electrically couple the semiconductor die to a package substrate. According to a further embodiment, the mixture is a molding compound that encapsulates the semiconductor die and the electrical connectors that couple the die to a lead frame, a package substrate, etc.

The non-conductive magnetic shielding materials described above provide a significant advantage over other magnetic materials that cannot be used in contact with electrical conductors. The non-conductive materials can be used between and around electrical connectors within a semiconductor package, insulating the connectors while magnetically shielding the semiconductor die(s) within the package. This is in contrast to other known package shielding materials that cannot be used in contact with electrical connectors, and that therefore cannot be used to provide magnetic shielding in regions where electrical connections are formed between a semiconductor die and an input/output interface element of the package.

Examples of non-conductive magnetic materials are described above in conjunction with various types of semiconductor packages, the materials including epoxy, molding compound, glob-top filler, underfill, etc. These materials are made magnetic by the incorporation of ferromagnetic particles into a polymer matrix, and are made non-conductive by the provision of an insulating coating on the ferromagnetic particles. The non-conductive character of the materials enables their use in semiconductor packages as magnetic shielding material that is in physical contact with electrical conductors, providing not only magnetic shielding, but also electrical insulation.

According to one embodiment, a device includes a magnetic shield that includs a plurality of ferromagnetic particles encapsulated in a matrix with each of the plurality of ferromagnetic particles being encapsulated by an insulating coating.

According to another embodiment, a device includes a semiconductor die have a plurality of die terminals and a package input/output interface having a plurality of package input terminals and a plurality of package output terminals. A magnetic shield is positioned to shield the semiconductor die from magnetic fields and includes a non-conductive magnetic shield element. The device includes a plurality of electrical connectors coupling respective die terminals to corresponding package input terminals. The electrical connectors extend through and are in physical contact with the non-conductive magnetic shield element.

According to another embodiment, a method for forming a magnetic shield is provided. The method includes forming a mixture of ferromagnetic particles having an insulating coating and a matrix material at a volume ratio of particles to mixture that imparts a selected magnetic permeability to the mixture. According to the method, the mixture is positioned around and between a plurality of electrical connectors that electrically couple contact terminals of a semiconductor die with contact terminals of an input/output interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a semiconductor die;
    a mixture covering a first portion of the semiconductor die and having:
        a plurality of first ferromagnetic particles;
        an insulating coating encapsulating each of the plurality of ferromagnetic particles; and
        a matrix containing the first ferromagnetic particles; and
    a matrix of epoxy material covering a second portion of the semiconductor die and having a plurality of second ferromagnetic particles in electrical contact with each other, wherein the mixture is non-conductive at a higher particle volume to mixture volume ratio (PMR) than the matrix of epoxy material having a plurality of second ferromagnetic particles in electrical contact with each other.

2. The device of claim 1, wherein the plurality of ferromagnetic particles are of a material having a high magnetic permeability.

3. The device of claim 1 wherein the matrix comprises a polymeric material.

4. The device of claim 1 wherein the matrix comprises a glob-top fill.

5. The device of claim 1 wherein the matrix comprises a die underfill.

6. The device of claim 1 wherein the matrix comprises a semiconductor package molding compound.

7. The device of claim 1 wherein the insulating coating comprises a polymer.

8. The device of claim 1 wherein the insulating coating comprises a dielectric oxide.

9. The device of claim 1, wherein the matrix of epoxy material is a magnetic epoxy and the device further comprises a first shield plate coupled to the magnetic epoxy.

10. The device of claim 9, further comprising a second shield plate coupled to the magnetic epoxy, wherein the first shield plate is above the semiconductor die and the second shield plate is below the semiconductor die.

11. The device of claim 10, wherein the second shield plate is in contact with the magnetic epoxy.

12. A device, comprising:
    a semiconductor die having a plurality of die terminals;
    a package input/output interface having a plurality of package input terminals and a plurality of package output terminals;
    a mixture covering a first portion of the semiconductor die including a non-conductive magnetic shield element shielding a first portion of the semiconductor die;
    a conductive magnetic shield element shielding a second portion of the semiconductor die; and
    a plurality of electrical connectors electrically coupling respective die terminals to corresponding package input terminals, each of the electrical connectors extending through and in physical contact with the non-conductive magnetic shield element.

13. The device of claim 12 wherein the non-conductive magnetic shield element includes a mixture comprising:
   a plurality of ferromagnetic particles;
   an insulating coating encapsulating each of the plurality of ferromagnetic particles; and
   a matrix containing the encapsulated ferromagnetic particles.

14. The device of claim 13 wherein the insulating coating is a ceramic material.

15. The device of claim 13 wherein the matrix is a polymer.

16. The device of claim 14, wherein the plurality of ferromagnetic particles are of a material having a high magnetic permeability.

17. The device of claim 12, wherein the conductive magnetic shield element includes a magnetic epoxy.

18. A method, comprising:
   forming a mixture of first ferromagnetic particles, each having an insulating coating, and matrix material at a volume ratio of first ferromagnetic particles to mixture that imparts a selected magnetic permeability to the mixture; and
   positioning the mixture around and between a plurality of electrical connectors that electrically couple contact terminals of a semiconductor die with contact terminals of an input/output interface; and
   positioning, on the semiconductor die, a magnetic epoxy including a plurality of second ferromagnetic particles on the semiconductor die, wherein the magnetic epoxy has a higher conductivity than the mixture based on conduction between the second ferromagnetic particles.

19. The method of claim 18, further comprising positioning a first shield plate coupled to the magnetic epoxy.

20. The method of claim 19, further comprising positioning a second shield plate coupled to the magnetic epoxy.

* * * * *